US008894827B2

(12) United States Patent
Jiang et al.

(10) Patent No.: US 8,894,827 B2
(45) Date of Patent: Nov. 25, 2014

(54) ELECTROCHROMIC TUNGSTEN OXIDE FILM DEPOSITION

(75) Inventors: Chong Jiang, Cupertino, CA (US); Byung Sung Leo Kwak, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 13/353,274

(22) Filed: Jan. 18, 2012

(65) Prior Publication Data

US 2012/0181167 A1 Jul. 19, 2012

Related U.S. Application Data

(60) Provisional application No. 61/433,688, filed on Jan. 18, 2011.

(51) Int. Cl.
*C23C 14/08* (2006.01)

(52) U.S. Cl.
USPC ............. 204/192.26; 204/192.13; 204/192.15

(58) Field of Classification Search
USPC ............................ 204/192.13, 192.26, 192.15
See application file for complete search history.

(56) References Cited

U.S. PATENT DOCUMENTS

| | | | |
|---|---|---|---|
| 5,324,537 A * | 6/1994 | Proscia et al. ................ | 427/109 |
| 6,296,747 B1 | 10/2001 | Tanaka | |
| 6,537,428 B1 * | 3/2003 | Xiong et al. ............ | 204/192.13 |
| 7,378,356 B2 | 5/2008 | Zhang et al. | |
| 7,381,657 B2 | 6/2008 | Zhang et al. | |
| 2010/0245973 A1 * | 9/2010 | Wang et al. .................. | 359/275 |

FOREIGN PATENT DOCUMENTS

| | | |
|---|---|---|
| EP | 0368567 A2 | 5/1990 |
| JP | 05-107565 A | 4/1993 |
| WO | WO2005036607 A2 | 4/2005 |

OTHER PUBLICATIONS

Lu, Horng-Hwa, "Effects of oxygen contents on the electrochromic properties of tungsten oxide films prepared by reactive magnetron sputtering," Journal of Alloys and Compounds, vol. 465, 2008, pp. 429-435.
Yang, Tien-Syh et al, "Structures and electrochromic properties of tungsten oxide films prepared by magnetron sputtering," Applied Surface Science, vol. 252, 2005, pp. 2029-2037.
International Search Report and Written Opinion issued Aug. 22, 2012 for PCT/US2012/021740.

(Continued)

*Primary Examiner* — Jason M Berman
(74) *Attorney, Agent, or Firm* — Pillsbury Winthrop Shaw Pittman LLP

(57) ABSTRACT

A deposition method for electrochromic $WO_x$ films involves cyclic deposition of very thin poisoned and metallic tungsten oxide layers to build up a film with a desired general stoichiometry with x in the range of $3>x>2.75$. The method may include: charging a deposition chamber with oxygen gas to poison a tungsten metal target; initiating sputtering of the target while reducing the oxygen partial pressure being supplied to the chamber and pumping the chamber; sputtering target for time $t_1+t_2$ to form first and second tungsten oxide layers, where the first layer is deposited during time $t_1$ from a poisoned target and the second layer is deposited during time $t_2$ from a metallic target, and where the stoichiometry of the film comprising the first and second layers is a function of $t_1$ and $t_2$; and, repeating until a desired film thickness is achieved.

18 Claims, 7 Drawing Sheets

T.J.Vink *et al.*, Lithium trapping at excess oxygen in sputter-deposited a-WO₃ films, Journal of Applied Physics, 85(3), pp 1540-1544, 1 February 1999

(56) References Cited

OTHER PUBLICATIONS

Vink, T.J., et al., "Lithium Trapping at Excess Oxygen in Sputter-Deposited a-$WO_3$ Films," Journal of Applied Physics 85(3), pp. 1540-1544, Feb. 1, 1999.

Yamamoto, A., et al., "Effects of Oxygen Gettering and Target Mode Change in the Formation Process of Reactively RF Sputtered $WO_x$ Thin Films," Vacuum, 66 (2002) pp. 269-273.

Parreira, N.M.G., et al., "Study of the Cathode Potential in a Sputtering Discharge by Pulsing the Reactive Gas: case of a W Target in an Ar—$O_2$ Atmosphere," Plasma Process. Polym., 2007, 4, pp. 62-68.

Niklasson, G. A., et al., "Optical Properties of Amorphous Tungsten Oxide Films: Effect of Stoichiometry," Journal of Physics: Conference Series 100 (2008) 082023.

Fouad, O.A., et al., "Reactive Sputtering of Titanium in Ar/$CH_4$ Gas Mixture: Target Poisoning and Film Characteristics," Thin Solid Films 517 (2009) pp. 5689-5694.

Waite, M.M., et al., "Target Poisoning During Reactive Sputtering of Silicon with Oxygen and Nitrogen," Materials Science and Engineering B 140 (2007) pp. 64-68.

Depla, D., et al., "Hysteresis Behavior During Reactive Magnetron Sputtering of $Al_2O_3$ Using a Rotating Cylindrical Magnetron," J. Vac. Sci Technol. A 24(4), Jul./Aug. 2006 pp. 934-938.

Glocker, D.A., et al., "AC Reactive Sputtering with Inverted Cylindrical Magnetrons," Society of Vacuum Coaters, $43^{rd}$ Annual Technical Conference Proceedings, Denver, Apr. 15-20, 2000, pp. 81-85.

Davis, J.A., et al., "High Power Pulse Reactive Sputtering of $TiO_2$," Society of Vacuum Coats, $47^{th}$ Annual Technical Conference Proceedings, Apr. 24-29, 2004, Dallas, Texas, pp. 215-218.

Guo, T.Y., et al., "Influence of Plasma Parameters on the Optical Properties of Tungsten Oxide Films Deposited by Reactive DC Magnetron Sputtering," Proceedings of the International Symposium on Plasma Chemistry (ISPC-19), Jul. 26-31, 2009, Bochum, Germany, available online only at http://www.ispc-conference.org/ispcproc/ispc19/335.pdf; last viewed Jul. 19, 2012.

* cited by examiner

T.J.Vink et al., Lithium trapping at excess oxygen in sputter-deposited a-WO$_3$ films, Journal of Applied Physics, 85(3), pp 1540-1544, 1 February 1999

ELECTROCHROMIC TUNGSTEN OXIDE FILM DEPOSITION

CROSS-REFERENCE TO RELATED APPLICATIONS

This application claims the benefit of U.S. Provisional Application No. 61/433,688 filed Jan. 18, 2011, incorporated herein by reference in its entirety.

FIELD OF THE INVENTION

Embodiments of the present invention relate generally to thin film deposition and more specifically to deposition of electrochromic tungsten oxide films.

BACKGROUND OF THE INVENTION

Tungsten trioxide ($WO_3$) has been studied for many years. It is one of the best materials for use in the fabrication of electrochromic (EC) devices, such as electrically tintable glass for use in buildings and automobiles. $WO_3$ has the desirable characteristics of transparency, chemical stability—as in the stoichiometry doesn't change with time after deposition—and relatively low cost. Typically, $WO_x$, where $3>x>2.75$, is desired for the EC application for the following reasons: (1) in the x>3 region, the oxygen is rich such that the $WO_x$ film may not be bleachable after lithium atom insertion; and (2) in the region x<2.75, the film is no longer transparent.

The deposition of $WO_3$ films is of considerable interest, not least because of their electrochromic properties. Physical vapor deposition (PVD) is one of the conventional methods used for depositing EC films. During the Physical Vapor Deposition (PVD) $WO_x$ deposition, the stoichiometry of the film (value of x) is controlled by the oxygen partial pressure. However, the value of x changes with the oxygen partial pressure too sharply such that it is very hard to control in the range of interest—see FIG. 1; in addition, the deposition rate is very low. See T. J. Vink, E. P. Boonekamp, R. G. F. A. Verbeek and Y. Tamminga, Lithium trapping at excess oxygen in sputter-deposited a-$WO_3$ films, Journal of Applied Physics 85(3), pp. 1540-1544, 1 Feb. 1999. According to Vink et al.'s data, reproduced in FIG. 1, control of the oxygen partial pressure to achieve an O/W ratio (value of x) of around 2.85 is very difficult due to the rapid change of x with oxygen partial pressure—such a process would have a very narrow process window and consequently would likely be a process with poor yield.

The two factors—narrow process window and low deposition rate—make the prior art PVD $WO_x$ film deposition process unattractive for use in the EC industry. Clearly, there is a need for improved deposition methods which provide sufficient control of the x value to allow high yield deposition of EC $WO_x$ films with x in the desired range of $3>x>2.75$. Furthermore, there is a need for a deposition method for these EC films which provides a high enough deposition rate to satisfy manufacturing throughput targets at relatively low cost.

SUMMARY OF THE INVENTION

The present invention generally relates to thin film deposition and techniques for controlling the film stoichiometry in instances where there is a very narrow process window at a desired stoichiometry, as for electrochromic tungsten oxide.

The narrow process window and low deposition rate of prior art PVD $WO_x$ film deposition processes are highly undesirable in the EC industry. The present invention addresses these issues, providing a new deposition method for EC $WO_x$ films which involves cyclic deposition of very thin poisoned and metallic tungsten oxide layers to build up a film with a desired general stoichiometry. Embodiments of the invention allow EC $WO_x$ films to be deposited with control of the x value sufficiently accurately to achieve a general stoichiometry with x in the desired range of $3>x>2.75$ by varying the metallic/poison deposition time ratio. Films with x in this range exhibit the desired properties of transparency and sheet resistance a little lower than for $WO_3$. Furthermore, embodiments of the present invention allow the deposition rate to be significantly improved over prior art PVD methods.

Some methods of the present invention may also be usefully applied to the deposition of other materials which exhibit narrow process windows, such as certain metal oxides and phosphates—for example, $AlO_x$, $NiO_x$.

According to some embodiments of the present invention, a method of depositing a stoichiometrically controlled tungsten oxide thin film includes: charging a deposition chamber with oxygen gas for time $t_0$ to poison a tungsten metal target; turning on power to initiate sputtering of the target and reducing the oxygen partial pressure being supplied to the deposition chamber while continuing to pump the deposition chamber, resulting in the oxygen partial pressure gradually dropping in the deposition chamber—here the reduced oxygen partial pressure, pumping speed and sputter rate are set at levels that will allow the tungsten metal target to transition into a metallic state during a chosen fraction of the sputter deposition time; sputtering tungsten target for time $t=t_1+t_2$ to form first and second tungsten oxide layers (130), where the first tungsten oxide layer is deposited during time $t_1$ from a poisoned target and the second tungsten oxide layer is deposited during time $t_2$ from a metallic target, and where the stoichiometry of the film comprising the first and second tungsten oxide layers is a function of $t_1$ and $t_2$; and, repeating the above process until a desired film thickness is achieved. The stoichiometry of the deposited film is controlled by adjusting the ratio of $t_1$ to $t_2$.

Furthermore, this invention describes tools for carrying out the above method.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention generally relates to thin film deposition, particularly deposition of thin film electrochromic tungsten oxide. Electrochromic devices contain a coloration layer, such as electrochromic tungsten oxide. Electrochromic devices may be cathodically colored, anodically colored or a combination of both. The coloration may occur because of movement of an ion, such as lithium, between the cathode layer and the counter electrode layer. Although the examples given herein are of deposition methods for tungsten oxide coloration layers for EC devices, the teaching and principles of the present invention are applicable to thin film deposition and techniques for controlling the film stoichiometry in instances where there is a very narrow process window at a desired stoichiometry.

Figure 1:
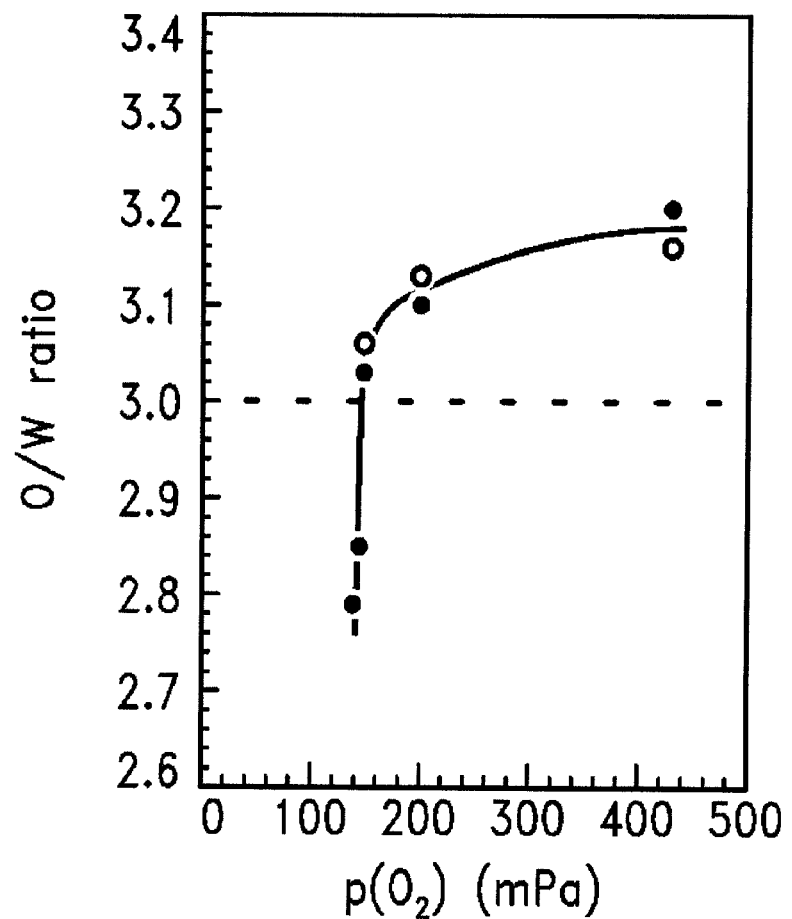
FIG. 1 is a plot of the O/W ratio for sputter-deposited $WO_3$ films against oxygen partial pressure in the sputtering atmosphere, from T. J. Vink et al., Lithium trapping at excess oxygen in sputter-deposited a-$WO_3$ films, Journal of Applied Physics, 85(3), pp 1540-1544, 1 Feb. 1999.
Figure 2:
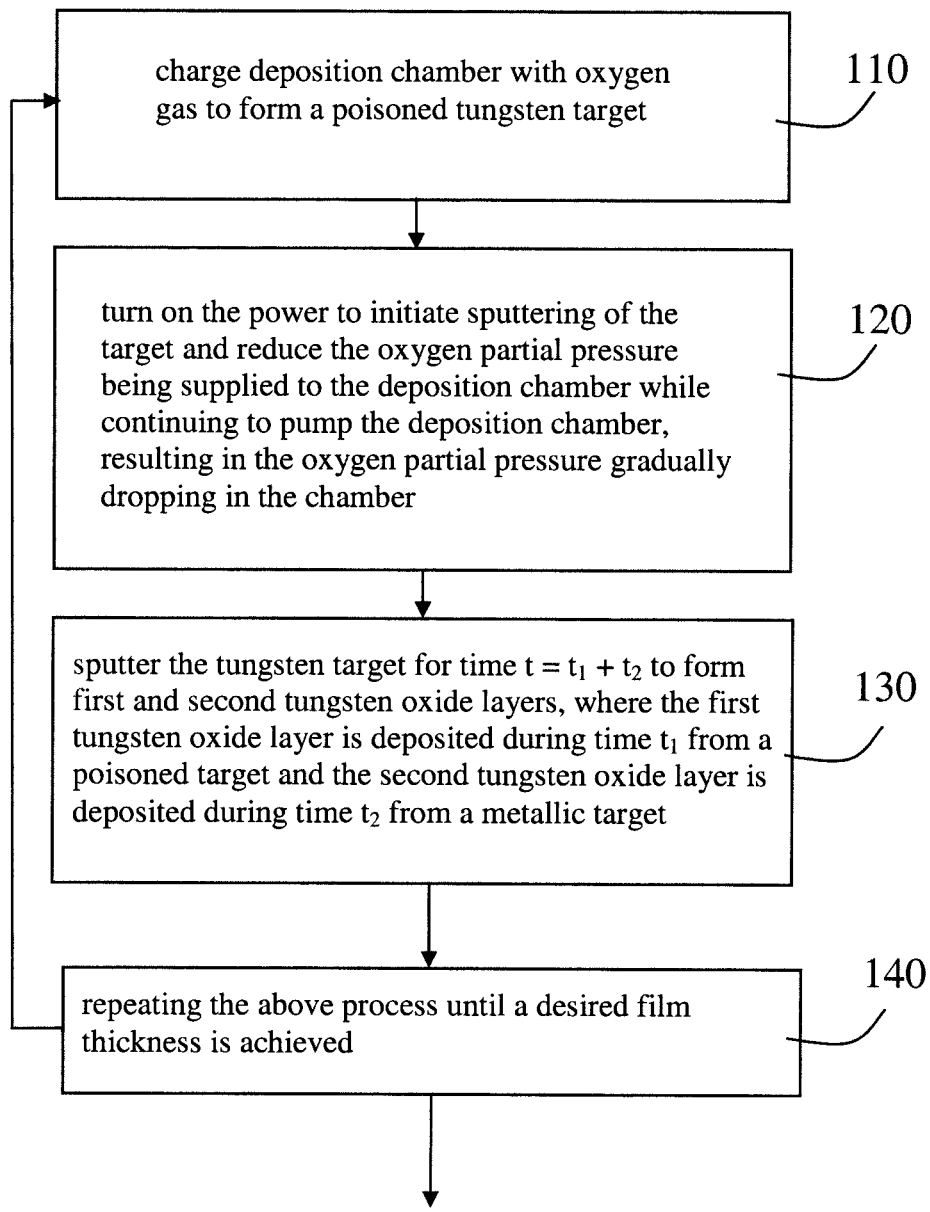
FIG. 2 is a flow chart for deposition of EC tungsten oxide thin films, according to some embodiments of the present invention.

FIG. 2 shows a process flow chart for deposition of thin film electrochromic tungsten oxide in a PVD chamber. The process flow includes the following basic steps: charging deposition chamber with oxygen gas for time $t_0$ to poison the tungsten metal target (110); turning on the power to initiate sputtering of the target and reducing the oxygen partial pressure being supplied to the deposition chamber while continuing to pump the deposition chamber, resulting in the oxygen partial pressure gradually dropping in the chamber (120)— here the reduced oxygen partial pressure, pumping speed and sputter rate are set at levels that will allow the tungsten metal target to transition into a metallic state during a chosen fraction of the sputter deposition time; sputtering tungsten target for time $t=t_1+t_2$ to form first and second tungsten oxide layers (130), where the first tungsten oxide layer is deposited during time $t_1$ from a poisoned target and the second tungsten oxide layer is deposited during time $t_2$ from a metallic target, and where the stoichiometry of the film comprising the first and second tungsten oxide layers is a function of $t_1$ and $t_2$; and, repeating the above process until a desired film thickness is achieved (140).

Figure 3:
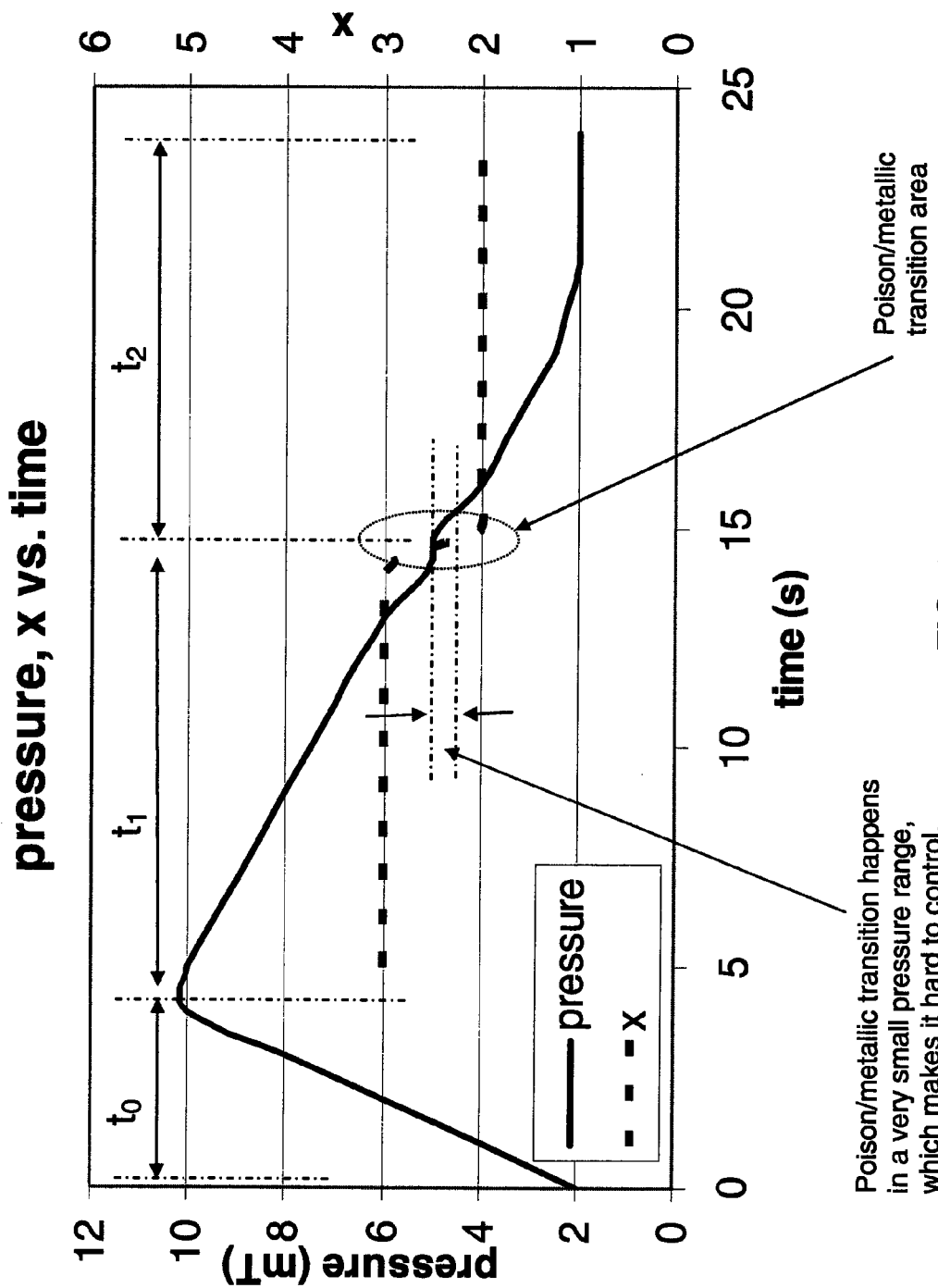
FIG. 3 is a graph of oxygen partial pressure and tungsten oxide stoichiometry against time, according to some embodiments of the present invention.

FIG. 3 shows an example of oxygen partial pressure, $p(O_2)$, in the deposition chamber and the stoichiometry, x, of the material being deposited plotted against time. Poisoning of the target occurs during time $t_0$, by charging the deposition chamber up to roughly 10 mTorr $p(O_2)$. The partial pressure of oxygen being supplied to the deposition chamber is then reduced to roughly 2 mTorr and the partial pressure of oxygen in the deposition chamber is seen to gradual drop from 10 mTorr to 2 mTorr. The poison to metallic transition at the surface of the tungsten metal target occurs within a very small oxygen partial pressure window, as indicated; therefore, the material being deposited during time $t_1$, prior to the transition, has a nominal composition of $WO_3$, and the material being deposited during time $t_2$, after the transition, has a nominal composition of $WO_2$. As discussed above, sputter deposition only occurs during times $t_1$ and $t_2$, and not during the charging period $t_0$. Note that FIG. 3 shows the general behavior expected for a deposition process as carried out on an AMAT 200 mm Endura Standard Physical Vapor Deposition (PVD) chamber, said equipment being described in more detail below.

The table below shows a sample recipe, according to some embodiments of the present invention carried out on an AMAT 200 mm Endura Standard Physical Vapor Deposition (PVD) chamber with a pulsed DC power supply.

| Step | Ar (sccm) | $O_2$ (sccm) | Power (Watts for specified time) |
|---|---|---|---|
| 1 | 20 | 100 | 0 W, 5 s |
| 2 | 20 | 20 | 3000 W, 15 s |
| 3 | 20 | 100 | 0 W, 5 s |
| 4 | 20 | 20 | 3000 W, 15 s |
| ... | ... | ... | ... |
| 29 | 20 | 100 | 0 W, 5 s |
| 30 | 20 | 20 | 3000 W, 15 s |

The ratio of time $t_1$ to time $t_2$ can be adjusted to give a desired average film stoichiometry. For example, increasing $t_2$ relative to $t_1$ increases the tungsten relative to oxygen and increasing $t_1$ relative to $t_2$ has the opposite effect. See the equations below for more details. Note that a film of 3 k to 5 k Ångstroms in thickness will typically be deposited by multiple cycles (approx. 30) of depositing a $WO_3$ film from a "poisoned" target followed by a $WO_2$ film from a metallic target.

Tungsten oxide films have been deposited according to some embodiments of the present invention. The following equipment was used: an AMAT 200 mm Endura Standard Physical Vapor Deposition (PVD) chamber was used as the deposition chamber with a 99.99% tungsten metal target; a pedestal for holding a substrate, where the temperature of the pedestal may be controlled; a pulsed DC power supply was connected between the pedestal and the target; vacuum pumps and gas flow controllers for controlling the pressure in the chamber during processing in the range of 2 to 10 mTorr.

The process variables were scanned to find a process window around the metallic/poisoned tungsten oxide transition point. Using the equipment configured as described above, the transition occurs around 42% oxygen for a total 48 sccm gas flow (total pressure is around 4.5 mTorr, total gas is the mixture of argon gas and oxygen gas). Then a recipe is developed at the transition point, with a "charge" step prior to the normal deposition; this "charge" step has higher gas flow (and higher pressure) to poison (oxidize) the tungsten target. The recipe is run while monitoring the recipe time for the different deposition stages—see sample recipe above. In the first part of the power on time, the process is in the poison mode such that the deposited film is $WO_3$. The process is continued until all of the poison layer on the target has been sputtered away. In the second part of the deposition process, the process was operated in the metallic mode such that the deposited film is tungsten rich—a metallic film with stoichiometry of $WO_2$. During the two deposition stages, the chamber pressure continues to drop from 10 mTorr to 2 mTorr.

The relative amounts of poisoned/metallic deposition times determine the O/W ratio (stoichiometry) of the deposited film. The process is repeated—the charge step followed by first and second deposition parts—multiple times to get the desired deposited film thickness. Embodiments of the present invention allow EC $WO_x$ films to be deposited with control of the x value sufficiently accurately to achieve a general stoichiometry with x in the desired range of $3>x>2.75$ by varying the metallic/poison deposition time ratio. Films with x in this range exhibit the desired properties of transparency and sheet resistance of the order of a few hundred kOhms per square for 3 k to 5 k Ångstrom thick films with good transparency.

The transition rate from poison mode deposition to metallic mode deposition is controlled by the deposition power— faster transition for higher deposition power. Higher power yields higher throughput and shorter deposition time; however, the O/W ratio becomes harder to control at higher powers. A suitable balance of control and throughput was found with the equipment described above when using 2 kw power (75% duty-cycle), for which the metallic/poison deposition time ratio is about 12 sec/18 sec. Using this setting, a 5000 Å $WO_x$ film deposition time is less than 15 minutes (with an average deposition rate of >5 Å/sec). Note that the pressure and target voltage are in a "dynamic" status around the metallic-poison transition point and the shorter the deposition times $t_1$ and $t_2$, the better the depth uniformity.

Furthermore, higher substrate temperature during deposition may make the film stoichiometry more uniform in depth. Although, deposition of films with the equipment described above with the substrate at room temp, 250° C., and 250° C. plus 480° C. anneal shows no significant variation in stoichiometry with depth, indicating the room temperature deposition may be good enough to yield a stoichiometrically uniform film.

The stoichiometry of the tungsten oxide films deposited by some embodiments of the present invention is defined by x, which is the ratio of O/W, and is given by:

$$x=\{3 \cdot s_1 + 2 \cdot s_2 \cdot (\rho_2/\rho_1)\}/(s_1 + s_2 \cdot (\rho_2/\rho_1)) \quad (1)$$

where $s_1$ is the thickness of $WO_3$ and $s_2$ is the thickness of $WO_2$, and $\rho_1$ is the density of $WO_3$ and $\rho_2$ is the density of $WO_2$. Furthermore, $s_1$ and $s_2$ are related to the deposition rates of $WO_3$ and $WO_2$ and respective deposition times $t_1$ and $t_2$, as follows:

$$s_1 = \text{deposition rate}(WO_3) \cdot t_1 \quad (2)$$

$$s_2 = \text{deposition rate}(WO_2) \cdot t_2 \quad (3)$$

The duty cycles for the deposition steps of the two different stoichiometries of tungsten oxide are given by:

$$\text{duty cycle}(WO_3) = t_1/(t_1 + t_2) \quad (4)$$

$$\text{duty cycle}(WO_2) = t_2/(t_1 + t_2) \quad (5)$$

This assumes that the process switches from $WO_3$ to $WO_2$ deposition and back again without significant delay and without the need for tungsten target conditioning.

Furthermore, the chamber pressures and gas flows may be varied from those described above. For example, the chamber start and finish pressures may be limited to a narrower range than the 10 mTorr to 2 mTorr described above—9 mTorr to 3 mTorr, for example. More deposition cycles of reduced time may be used. Those skilled in the art will appreciate after reading the present disclosure that adjustments of these parameters may be made to improve the uniformity of deposited films, if required.

Figure 4:
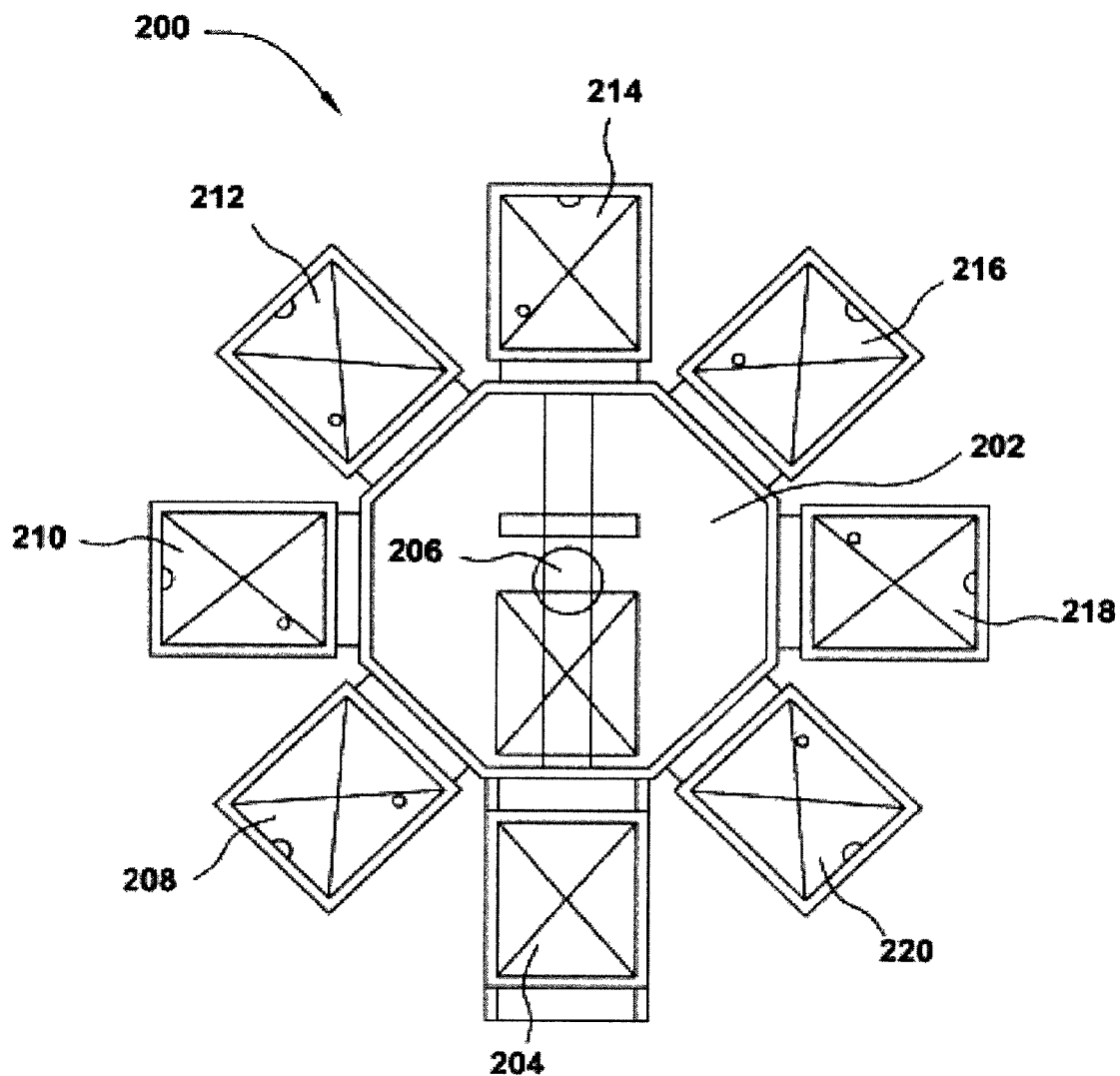
FIG. 4 is a schematic illustration of a thin film deposition cluster tool, according to some embodiments of the present invention.

FIG. 4 is a schematic illustration of a processing system 200 for fabricating an EC device according to some embodiments of the present invention. The processing system 200 includes a central transfer chamber 202 that, in the embodiment shown in FIG. 4, may have eight sides to accommodate 8 chambers attached thereto. One of the chambers may include a load lock chamber 204 for introducing and removing substrates from the processing system 200. A robot 206 centrally located within the transfer chamber 202 may be used to transfer a substrate between chambers. One processing chamber 208 may be utilized for depositing a barrier layer over the substrate. A second processing chamber 210 may be used for fabrication of a transparent conductive coating layer over the barrier layer. A third processing chamber 212 may be used for fabrication of a coloration layer, such as tungsten oxide deposited using a method according to some embodiments of the present invention, over the transparent conductive coating layer. A fourth processing chamber 214 may be used for fabrication of an electrolyte layer over the coloration layer. A fifth processing chamber 216 may be used to fabricate an anode layer over the electrolyte layer. A sixth processing chamber 218 may be used to fabricate a second transparent conductive coating over the anode layer. A seventh processing chamber 220 may be used to fabricate a capping or barrier layer over the ECW structure. Examples of suitable cluster tool platforms include AKT's display cluster tools, such as the Generation 10 display cluster tools. It is to be understood that while a cluster arrangement has been shown for the processing system 200, a linear system may be utilized in which the processing chambers are arranged in a line without a transfer chamber so that the substrate continuously moves from one chamber to the next chamber.

Figure 5:
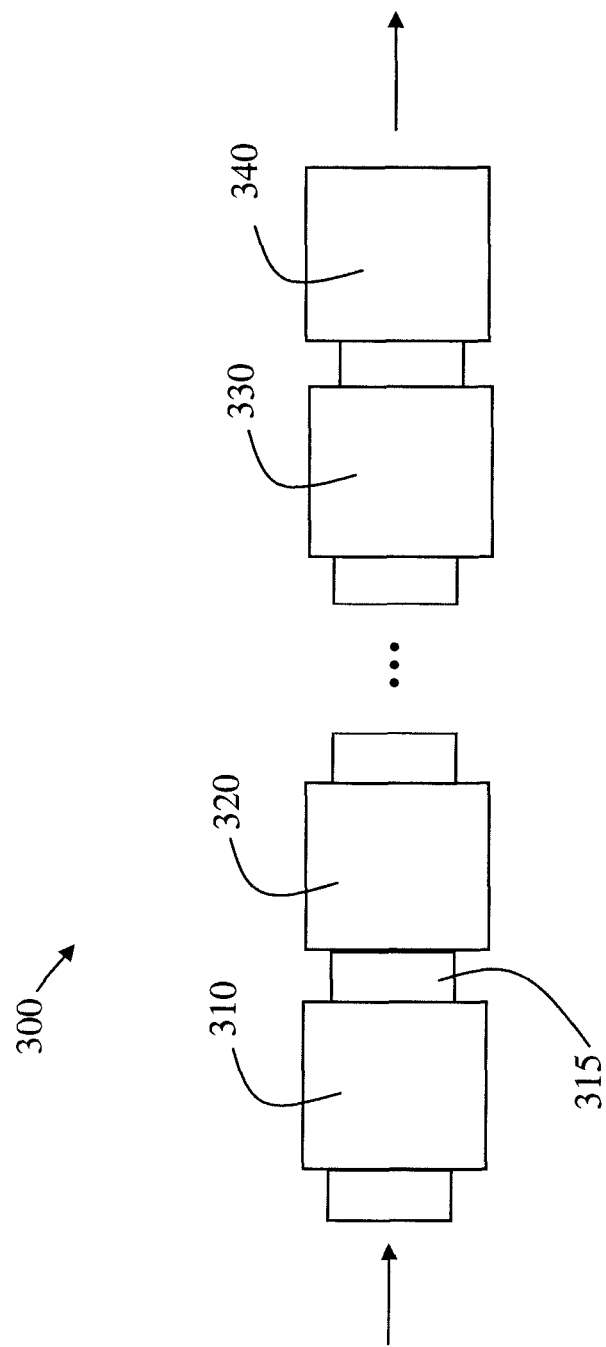
FIG. 5 is a representation of a thin film deposition system with multiple in-line tools, according to some embodiments of the present invention.

FIG. 5 shows a representation of an in-line fabrication system 300 with multiple in-line tools 310, 320, 330, 340, etc., according to some embodiments of the present invention. In-line tools may include tools for depositing all the layers of an electrochromic device. Furthermore, the in-line tools may include pre- and post-conditioning chambers. For example, tool 310 may be a pump down chamber for establishing a vacuum prior to the substrate moving through a vacuum airlock 315 into a deposition tool 320. Some or all of the in-line tools may be vacuum tools separated by vacuum airlocks 315. Note that the order of process tools and specific process tools in the process line will be determined by the particular electrochromic device fabrication method being used. For example, one or more of the in-line tools may be dedicated to depositing a tungsten oxide coloration layer according to some embodiments of the present invention. Furthermore, substrates may be moved through the in-line fabrication system oriented either horizontally or vertically.

Figure 6:
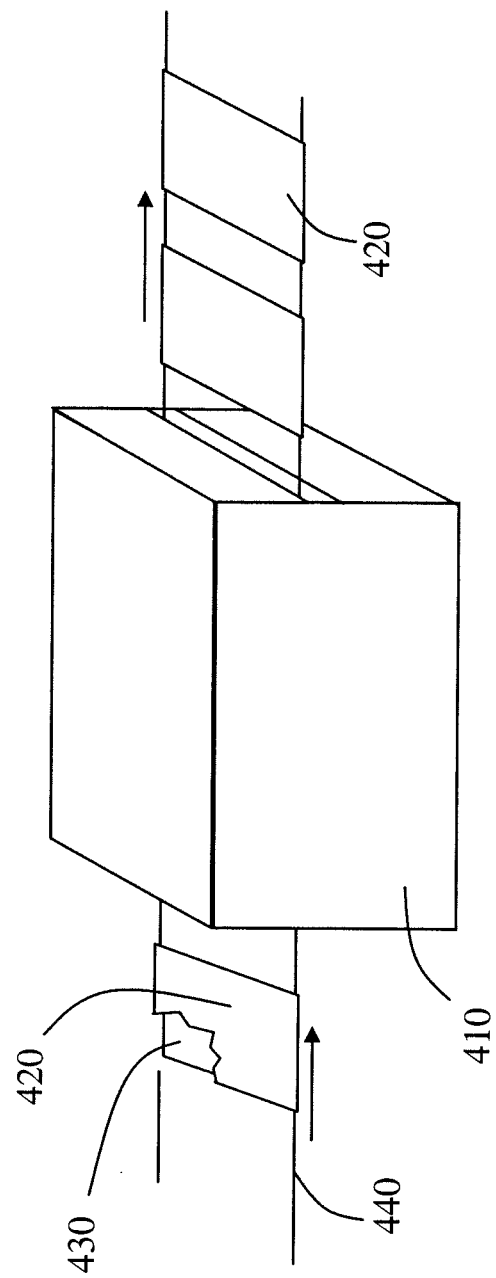
FIG. 6 is a representation of an in-line deposition tool, according to some embodiments of the present invention.

In order to illustrate the movement of a substrate through an in-line fabrication system such as shown in FIG. 5, in FIG. 6 a substrate conveyer 440 is shown with only one in-line tool 410 in place. A substrate holder 420 containing a large area substrate 430 (the substrate holder is shown partially cut-away so that the substrate can be seen) is mounted on the conveyer 440, or equivalent device, for moving the holder and substrate through the in-line tool 410, as indicated. Suitable in-line platforms for processing tool 410 are Applied Material's Aton™ and New Aristo™.

Figure 7:
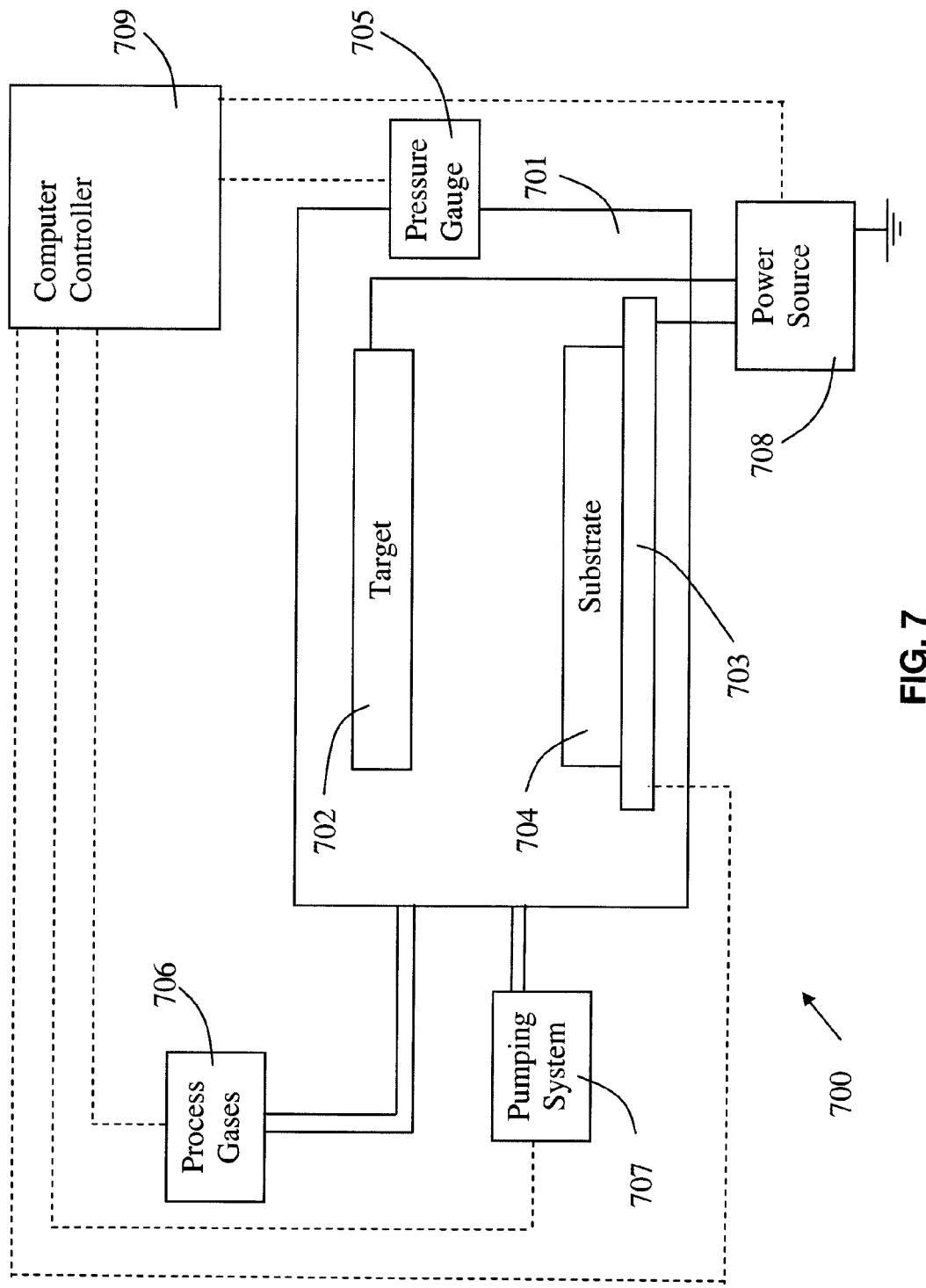
FIG. 7 is a representation of a computer controlled deposition chamber, according to some embodiments of the present invention.

FIG. 7 shows a representation of a computer controlled deposition chamber 700, which may be configured for use in cluster or in-line tools, according to some embodiments of the present invention. A chamber 701 includes a target 702 and a pedestal 703 for holding a substrate 704. The pedestal may have temperature control. The chamber has a pressure gauge 705, process gas supply with gas flow controllers 706, and vacuum pumping system 707. A power source 708 is connected between target 702 and pedestal 703. The power source may be a pulsed DC power source. (Supplementary power sources may also be used, attached to the pedestal and/or target.) A computer controller 709 is connected to the process gas supply, vacuum pumps, pressure gauge, power source, pedestal, etc. The computer controller has a memory and processor. A program for operation of the deposition chamber for forming thin films as described above may be loaded into the memory. The processor runs the program causing the chamber to operate to deposit thin films as described above. For example, the computer controller may operate the deposition chamber according to the process flow of FIG. 2 and may run recipes as provided above in the table.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of depositing a stoichiometrically controlled tungsten oxide thin film comprising:
    charging a deposition chamber with oxygen gas for time $t_0$ to poison the surface of a tungsten metal target with oxygen;
    sputtering of said tungsten metal target and reducing the oxygen partial pressure being supplied to said deposition chamber while vacuum pumping said deposition chamber, wherein the oxygen partial pressure is gradually decreased in said deposition chamber as said tungsten metal target is sputtered;
    depositing tungsten oxide sputtered from said tungsten metal target for a time $t=t_1+t_2$ to form first and second tungsten oxide layers on a substrate, wherein said first tungsten oxide layer is deposited during said time $t_1$ from said tungsten metal target with the poisoned surface and said second tungsten oxide layer is deposited during said time $t_2$ from said tungsten metal target with a metallic surface, and wherein the stoichiometry of the film comprising the first and second tungsten oxide layers is a function of $t_1$ and $t_2$; and
    repeating said charging, sputtering and depositing until a desired film thickness is achieved;
    wherein there is no sputtering and no depositing during said charging.

2. The method of claim 1, wherein the stoichiometry of the deposited film is controlled by adjusting the ratio of $t_1$ to $t_2$.

3. The method of claim 1, wherein the reduced oxygen partial pressure, vacuum pumping speed and sputter rate are set to transition the surface of said tungsten metal target from the oxygen poisoned state to the metallic state during a fraction of said time t.

4. The method of claim 1, wherein said first tungsten oxide layer is $WO_3$.

5. The method of claim 1, wherein said second tungsten oxide layer is $WO_2$.

6. The method of claim 1, wherein said stoichiometry of said film is $WO_x$, x being in the range of 2.75 to 3.

7. The method of claim 1, wherein said substrate is at room temperature.

8. The method of claim 1, wherein said film is less than 500 nanometers thick.

9. The method of claim 8, wherein said charging, sputtering and depositing are repeated more than 20 times.

10. The method of claim 8, wherein said charging, sputtering and depositing are repeated more than 30 times.

11. The method of claim 1, wherein said sputtering is pulsed DC sputtering.

12. The method of claim 1, wherein the oxygen partial pressure in said deposition chamber is gradually decreased by a factor of ten over said time t from a starting pressure of less than 10 mTorr.

13. The method of claim 1, wherein the oxygen partial pressure is gradually decreased in said deposition chamber from 10 mTorr to 2 mTorr over said time t.

14. The method of claim 1, wherein said film is optically transparent.

15. The method of claim 1, wherein the average deposition rate of said film is greater than 5 Ångstroms per second.

16. The method as in claim 1, wherein said charging includes flowing oxygen gas at a higher rate than during said sputtering and said depositing.

17. The method as in claim 16, wherein said higher rate is five times higher.

18. The method as in claim 1, further comprising, before said charging, said sputtering, said depositing and said repeating:
    scanning process variables to identify a process window around the metallic/poisoned tungsten oxide transition point; and
    developing a recipe including setting gas flow, deposition chamber pressure, sputter rate and times $t_1$ and $t_2$ to determine the stoichiometry of the deposited film.

* * * * *